US008372296B2

(12) United States Patent
Shoji et al.

(10) Patent No.: US 8,372,296 B2
(45) Date of Patent: Feb. 12, 2013

(54) MANUFACTURING METHOD FOR A THERMAL HEAD

(75) Inventors: Noriyoshi Shoji, Chiba (JP); Norimitsu Sanbongi, Chiba (JP); Toshimitsu Morooka, Chiba (JP); Keitaro Koroishi, Chiba (JP)

(73) Assignee: Seiko Instruments Inc. (JP)

( * ) Notice: Subject to any disclaimer, the term of this patent is extended or adjusted under 35 U.S.C. 154(b) by 364 days.

(21) Appl. No.: 12/804,954

(22) Filed: Aug. 3, 2010

(65) Prior Publication Data

US 2011/0031212 A1 Feb. 10, 2011

(30) Foreign Application Priority Data

Aug. 6, 2009 (JP) ................................ 2009-183555

(51) Int. Cl.
*H01L 21/302* (2006.01)
*B41J 2/345* (2006.01)

(52) U.S. Cl. ................ 216/13; 216/27; 216/33; 216/40; 216/52; 216/84; 216/85; 29/611; 156/281; 438/5; 438/7; 438/14; 438/15; 438/689; 438/977

(58) Field of Classification Search ........................ None
See application file for complete search history.

(56) References Cited

U.S. PATENT DOCUMENTS 5,313,752 A * 5/1994 Hatzinikolas .................. 52/243
5,335,550 A * 8/1994 Satou .............................. 73/727
6,184,913 B1 * 2/2001 Nagano et al. ................ 347/203
7,768,541 B2 * 8/2010 Koroishi et al. .............. 347/202
8,111,273 B2 * 2/2012 Morooka et al. .............. 347/204
8,189,021 B2 * 5/2012 Morooka et al. .............. 347/206
8,212,849 B2 * 7/2012 Koroishi et al. .............. 347/202
8,253,765 B2 * 8/2012 Shoji et al. .................... 347/200
8,256,099 B2 * 9/2012 Shoji et al. ...................... 29/611
8,257,599 B2 * 9/2012 Sanbongi et al. ............... 216/27
2009/0265919 A1 * 10/2009 Shoji et al. ...................... 29/611
2010/0071414 A1 * 3/2010 Morooka et al. ............... 65/17.3
2011/0128340 A1 * 6/2011 Morooka et al. .............. 347/200
2011/0216147 A1 * 9/2011 Morooka et al. .............. 347/200
2012/0073122 A1 * 3/2012 Koroishi et al. ............. 29/610.1
2012/0073123 A1 * 3/2012 Shoji et al. ................... 29/610.1

FOREIGN PATENT DOCUMENTS

JP 200163123 3/2001
JP 2007320197 12/2007

* cited by examiner

*Primary Examiner* — Anita Alanko
(74) *Attorney, Agent, or Firm* — Adams & Wilks

(57) ABSTRACT

Provided is a manufacturing method for a thermal head, including: bonding a flat upper substrate in a stacked state onto a flat supporting substrate including a heat-insulating concave portion open to one surface thereof so that the heat-insulating concave portion is closed (bonding step (SA2)); thinning the upper substrate bonded onto the supporting substrate by the bonding step (SA2) (plate thinning step (SA3)); measuring a thickness of the upper substrate thinned by the plate thinning step (SA3) (measurement step (SA4)); deciding a target resistance value of heating resistors based on the thickness of the upper substrate, which is measured by the measurement step (SA4) (decision step (SA5)); and forming, at positions of a surface of the upper substrate thinned by the plate thinning step (SA3), the heating resistors having the target resistance value determined by the decision step (SA5), the positions being opposed to the heat-insulating concave portion (resistor forming step (SA6)). Thus, a high-efficiency thermal head capable of accurately outputting a target heating amount obtained by estimating an amount of heat wasted without being used is easily manufactured without using a special apparatus.

8 Claims, 10 Drawing Sheets

FIG. 6

| UPPER SUBSTRATE THICKNESS (μm) | TARGET RESISTANCE VALUE (Ω) |
|---|---|
| 10.0 OR MORE AND LESS THAN 12.5 | 220 |
| 12.5 OR MORE AND LESS THAN 15.0 | 210 |
| 15.0 OR MORE AND LESS THAN 17.5 | 200 |
| 17.5 OR MORE AND LESS THAN 20.0 | 190 |
| 20.0 OR MORE AND LESS THAN 22.5 | 180 |

MANUFACTURING METHOD FOR A THERMAL HEAD

BACKGROUND OF THE INVENTION

1. Field of the Invention

The present invention relates to a manufacturing method for a thermal head.

2. Description of the Related Art

There has been conventionally known a thermal head which is used in a thermal printer to be installed frequently in a small-sized information equipment terminal typified by a small-sized handy terminal, and which performs printing on a heat-sensitive recording medium by selectively driving some of a plurality of heating resistors based on printing data.

In the thermal head as described above, it is known to adjust resistance values of heating resistors (hereinafter, this adjustment is referred to as "resistance value trimming") in order to manage amount of heat generated by the heating resistors (for example, see Japanese Patent Application Laid-open No. 2001-63123). In a method for the resistance value trimming, which is described in Japanese Patent Application Laid-open No. 2001-63123, a predetermined voltage is applied to the respective heating resistors to detect heating temperatures thereof, and trimming energies are applied to the respective heating resistors to adjust heating characteristics thereof including resistance values, heat capacities, and the like so that the heating temperatures can be a target heating temperature within a predetermined range, whereby the heating temperatures are made uniform.

However, in the method for the resistance value trimming, which is described in Japanese Patent Application Laid-open No. 2001-63123, in order to set the target heating temperature of the heating resistors, the predetermined voltage must be applied to each of the heating resistors to measure the heating temperatures of all the heating resistors, resulting in a disadvantage in that much expense in time and effort is required. Further, there is a problem in that a large-scale apparatus such as a microscope-type infrared radiation thermometer must be used in order to measure the heating temperatures of the respective heating resistors.

SUMMARY OF THE INVENTION

The present invention has been made in view of the above-mentioned circumstances. It is an object of the present invention to provide a manufacturing method for a thermal head, which is capable of easily manufacturing without using the large-scale apparatus, a high-efficiency thermal head capable of accurately outputting a target heating amount obtained by estimating amount of heat wasted without being used.

In order to achieve the object described above, the present invention provides the following means.

According to the present invention, there is provided a manufacturing method for a thermal head, including: bonding a flat upper substrate in a stacked state onto a flat supporting substrate including an opening portion open to one surface thereof so that the opening portion is closed (bonding step); thinning the upper substrate bonded onto the supporting substrate by the bonding step (plate thinning step); measuring a thickness of the upper substrate thinned by the plate thinning step (measurement step); deciding a target resistance value of heating resistors based on the thickness of the upper substrate, which is measured by the measurement step (decision step); and forming, at positions of a surface of the upper substrate thinned by the plate thinning step, the heating resistors having the target resistance value determined by the decision step, the positions being opposed to the opening portion (resistor forming step).

In accordance with the present invention, by the bonding step, the upper substrate and the supporting substrate are bonded onto each other so that the opening portion is closed. As a result, a cavity portion is formed between the upper substrate and the supporting substrate. Here, the upper substrate having the heating resistors formed on the surface thereof by the resistor forming step functions as a heat storage layer that stores heat generated by the heating resistors, and meanwhile, the cavity portion functions as a hollow heat-insulating layer that blocks the heat transferred from the heating resistors through the upper substrate toward the supporting substrate. Hence, the upper substrate is thinned by the plate thinning plate, whereby a heat capacity of the upper substrate as the heat storage layer is reduced, and an amount of heat diffused toward the upper substrate among the amount of heat generated in the heating resistors is suppressed. Thus, it is possible to increase an amount of usable heat.

In this case, the amount of usable heat depends on the thickness of the upper substrate thinned by the plate thinning step. However, the target resistance value is determined by the determination step based on the thickness of the thinned upper substrate, which is measured by the measurement step, and hence the heating resistors that accurately generate the amount of usable heat by previously estimating the amount of heat diffused toward the upper substrate can be formed in the resistor forming step irrespective of the thickness of the thinned upper substrate.

Hence, a high-efficiency thermal head capable of accurately outputting the target heating amount obtained by estimating an amount of heat wasted without being used can be easily manufactured without measuring a heating temperature of each of the heating resistors or using a special apparatus for temperature measurement as the prior art.

According to the present invention, there is provided a manufacturing method for a thermal head, including: bonding a flat upper substrate in a stacked state onto a flat supporting substrate including an opening portion open to one surface thereof so that the opening portion is closed (bonding step); thinning the upper substrate bonded onto the supporting substrate by the bonding step (plate thinning step); forming heating resistors at positions of a surface of the upper substrate thinned by the plate thinning step, which are opposed to the opening portion (resistor forming step); measuring a thickness of the upper substrate thinned by the plate thinning step (measurement step); determining a target resistance value of the heating resistors based on the thickness of the upper substrate, which is measured by the measurement step (determination step); and adjusting a resistance value of the heating resistors so that the resistance value substantially conforms with the target resistance value determined by the determination step (resistance value adjustment step).

According to the present invention, the target resistance value is determined by the determination step based on the thickness of the thinned upper substrate, and hence the resistance value of the heating resistors can be adjusted through previously estimating the amount of heat diffused toward the upper substrate in the resistance value adjustment step irrespective of the thickness of the thinned upper substrate, so that the heating resistors accurately generate the amount of usable heat. Thus, it is possible to easily manufacture a high-efficiency thermal head, without using the large-scale apparatus, which is capable of accurately outputting a target heating amount obtained by estimating amount of heat wasted without being used.

In the above-mentioned invention, in the measurement step, light may be irradiated onto a region of the upper substrate, which is opposed to the opening portion, and positions of the surface and back surface of the upper substrate may be detected by rays reflected on the surface and a back surface, whereby the thickness of the upper substrate is measured.

At a position of the opening portion, the surface of the upper substrate is exposed to the outside and faces to the air, and in addition, the back surface thereof faces to the air in the cavity formed by closing the opening portion. Hence, a difference in refractive index between the upper substrate and the air is used, whereby the thickness of the upper substrate bonded onto the supporting substrate can be easily measured only by irradiating light onto such a region of the upper substrate and detecting rays individually reflected on the surface and the back surface of the upper substrate.

In the above-mentioned invention, the manufacturing method for a thermal head may further include forming a through hole penetrating the upper substrate in a plate thickness direction thereof at a position of the surface of the upper substrate, where the heating resistors are prevented from being formed (through hole forming step), in which, in the bonding step, the supporting substrate and the upper substrate may be bonded onto each other so that one end of the through hole is closed by the one surface of the supporting substrate, and in the measurement step, a depth of the through hole of the upper substrate bonded onto the supporting substrate may be measured.

With such a configuration, even in a state where the upper substrate and the supporting substrate are bonded onto each other, the thickness of only the upper substrate can be known by measuring the depth of the through hole. Note that the depth of the through hole may be measured, for example, through inserting a measuring instrument such as a micrometer into the through hole.

In the above-mentioned invention, in the resistance value adjustment step, predetermined energy may be applied to each of the heating resistors, whereby the resistance value is adjusted.

With such a configuration, the resistance value of the heating resistor can be changed easily in a short time.

Further, in the above-mentioned invention, a voltage pulse may be used as the predetermined energy.

With such a configuration, the resistance value can be easily changed in such a manner that the voltage pulse with a higher voltage than at the time of a usual printing operation is merely applied to the heating resistors without using a special apparatus for adjusting the resistance value of the heating resistors.

Further, in the above-mentioned invention, a laser beam may be used as the predetermined energy.

With such a configuration, a resistance value of a portion onto which the laser beam is irradiated can be changed by irradiating the laser beam onto the heating resistor. Further, a range where the resistance value of the heating resistor is changed can be adjusted by changing an irradiation width of the laser beam.

Further, in the above-mentioned invention, in the determination step, the target resistance value may be read from a database in which the thickness of the upper substrate and the target resistance value are associated with each other.

With such a configuration, the target resistance value of the heating resistor can be determined easily and rapidly based on the database.

According to the present invention, there is exerted an effect of easily manufacturing, without using the large-scale apparatus, a high-efficiency thermal head capable of accurately outputting a target heating amount obtained by estimating amount of heat wasted without being used.

BRIEF DESCRIPTION OF THE DRAWINGS

In the accompanying drawings:

FIG. 6 is a database in which the thickness of the upper substrate and a target resistance value of heating resistors are associated with each other;

DETAILED DESCRIPTION OF THE PREFERRED EMBODIMENTS

First Embodiment

A manufacturing method for a thermal head according to a first embodiment of the present invention is described below with reference to the drawings.

Figure 1:
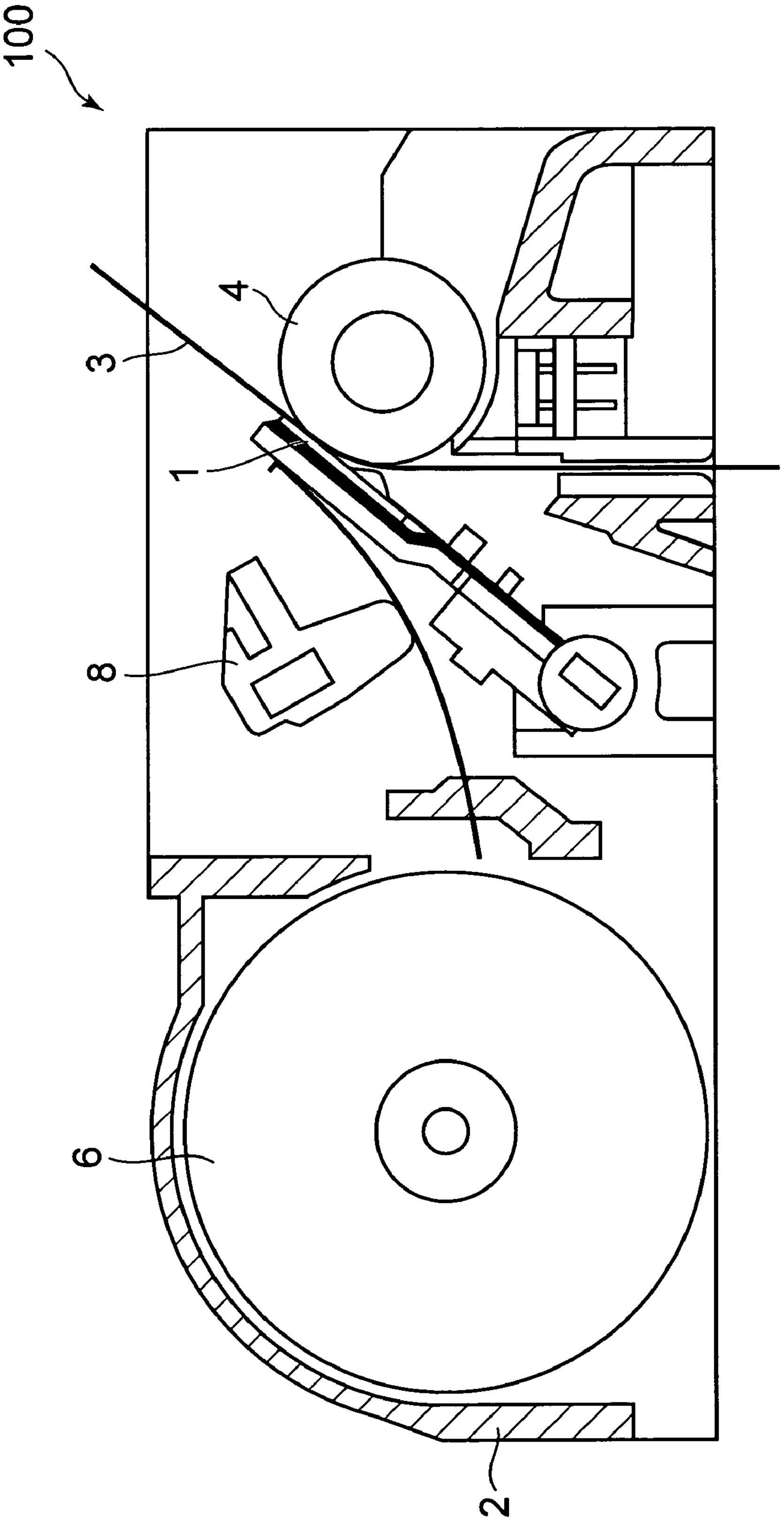
FIG. 1 is a schematic cross-sectional view of a thermal printer including a thermal head manufactured by a manufacturing method for a thermal head according to a first embodiment of the present invention.

The manufacturing method for a thermal head according to this embodiment is a manufacturing method for a thermal head 1 (see FIG. 3 and FIG. 4) for use in a thermal printer 100 as illustrated in FIG. 1.

Figure 2:
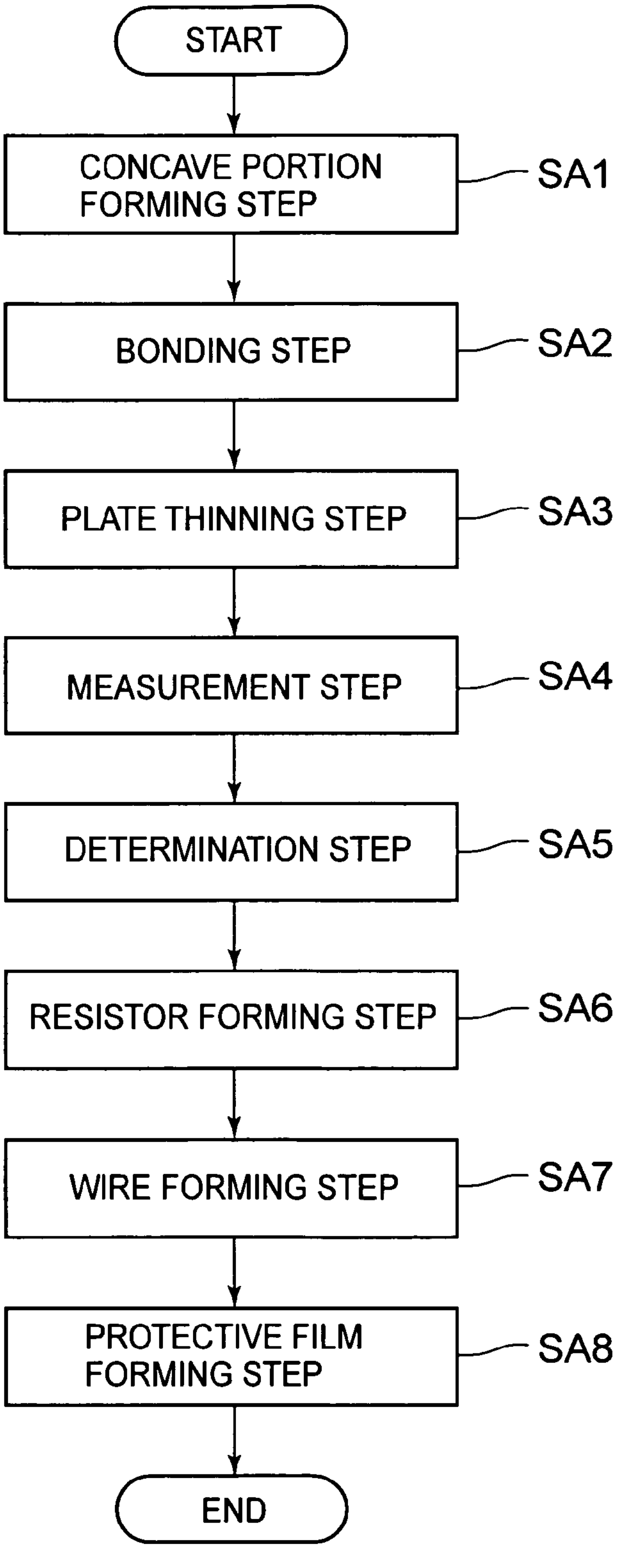
FIG. 2 is a flowchart of the manufacturing method for a thermal head according to the first embodiment of the present invention.

As illustrated in a flowchart of FIG. 2, the manufacturing method includes: a concave portion forming step (opening portion forming step) SA1 of forming a heat-insulating concave portion (opening portion) 32 open to one surface of a flat plate-like supporting substrate 13; a bonding step SA2 of bonding a flat plate-like upper substrate 11 onto the supporting substrate 13, in which the heat-insulating concave portion 32 is formed, in a stacked state so as to close the heat-insulating concave portion 32; a plate thinning step SA3 of thinning the upper substrate 11 bonded onto the supporting substrate 13; a measurement step SA4 of measuring a thickness of the thinned upper substrate 11; a determination step SA5 of determining a target resistance value of heating resistors 14 based on the measured thickness of the upper substrate 11; and a resistor forming step SA6 of forming the heating resistors 14, which have the target resistance value determined by the determination step SA5, at positions which are opposed to the heat-insulating concave portion 32 and located on a surface of the upper substrate 11.

The manufacturing method further includes: a wire forming step SA7 of connecting electrode wires 16 to the heating resistors 14 formed by the resistor forming step SA6; and a protective film forming step SA8 of forming a protective film 18 that partially covers the surface of the upper substrate 11 including the heating resistors 14 and the electrode wires 16 and protects the surface.

Figure 3:
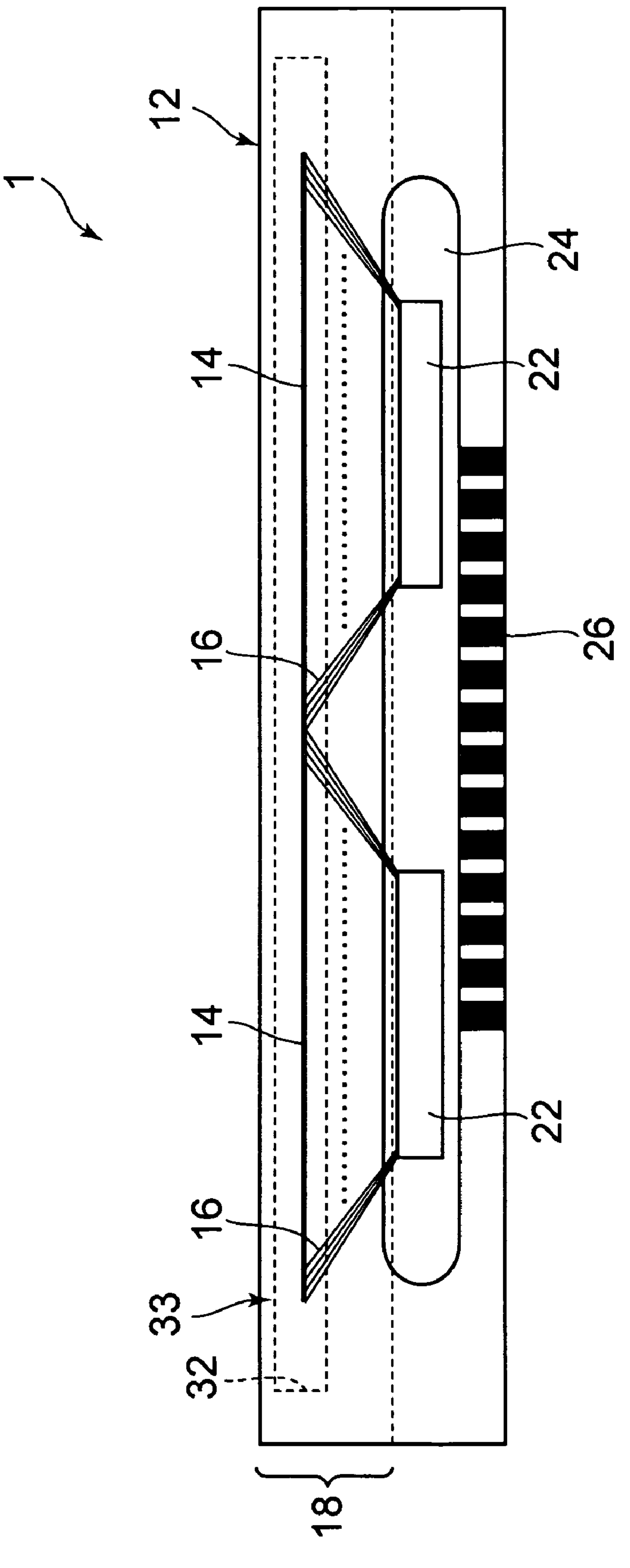
FIG. 3 is a plan view of the thermal head of FIG. 1 when viewed from a protective film side.
Figure 4:
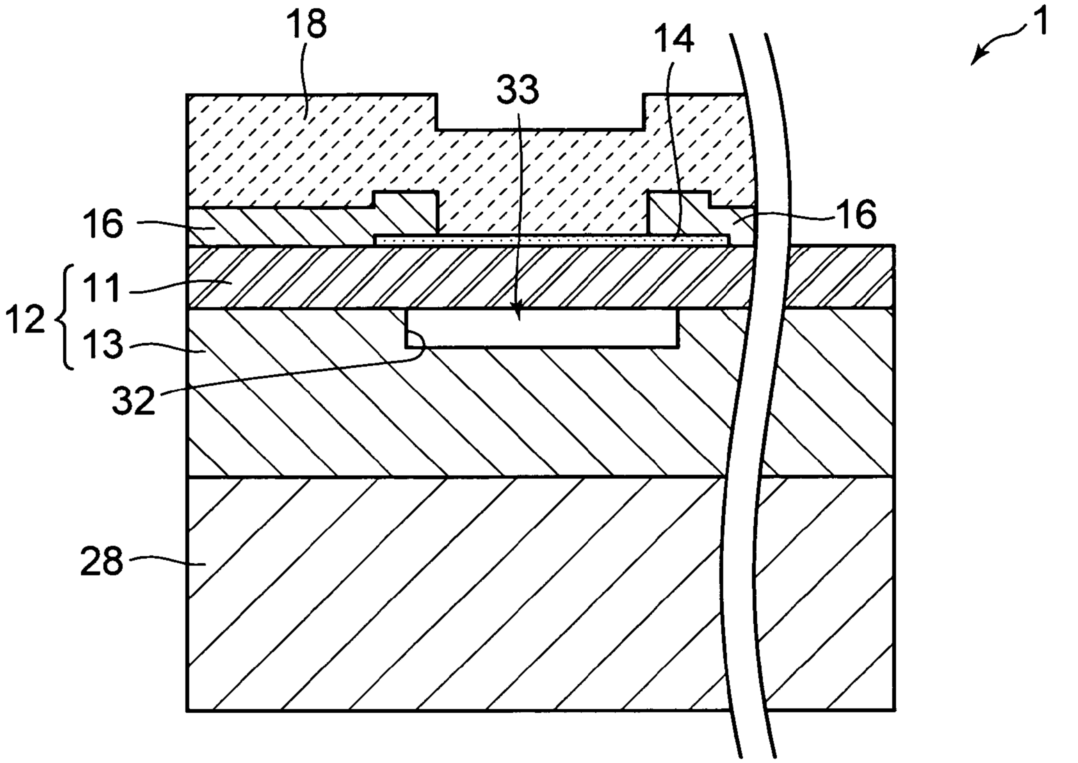
FIG. 4 is a longitudinal cross-sectional view of the thermal head of FIG. 3 taken along a direction perpendicular to a longitudinal direction of the thermal head.

Note that, though the heating resistors 14 are illustrated as one straight line in FIG. 3, actually, a plurality of pieces (for example, 4,096) thereof are arrayed at minute intervals in a longitudinal direction of a substrate body 12.

The respective steps are specifically described below.

First, in the opening portion forming step SA1, an insulative glass substrate having a thickness approximately ranging from 300 μm to 1 mm is used as the supporting substrate 13. In the one surface of the supporting substrate 13, at positions thereof to which the heating resistors 14 formed by the resistor forming step SA6 are opposed, the rectangular heat-insulating concave portion 32 extending in a longitudinal direction of the supporting substrate 13 is formed (Step SA1).

The heat-insulating concave portion 32 can be formed by performing, for example, sandblasting, dry etching, wet etching, or laser machining on the one surface of the supporting substrate 13.

When the sandblasting is performed on the supporting substrate 13, the one surface of the supporting substrate 13 is covered with a photoresist material, and the photoresist material is exposed to light using a photomask of a predetermined pattern, whereby there is cured a portion other than the region in which the heat-insulating concave portion 32 is formed.

After that, by cleaning the one surface of the supporting substrate 13 and removing the photoresist material which is not cured, etching masks (not shown) having etching windows formed in the region in which the heat-insulating concave portion 32 is formed can be obtained. In this state, the sandblasting is performed on the one surface of the supporting substrate 13, and the heat-insulating concave portion 32 having a predetermined depth is formed. Note that, it is preferred that the depth of the heat-insulating concave portion 32 be, for example, 10 μm or more and half or less of the thickness of the supporting substrate 13.

Further, when etching, such as the dry etching and the wet etching, is performed, as in the case of the sandblasting, the etching masks having the etching windows formed in the region in which the heat-insulating concave portion 32 is formed are formed on the one surface of the supporting substrate 13. In this state, by performing the etching on the one surface of the supporting substrate 13, the heat-insulating concave portion 32 having the predetermined depth is formed.

As such an etching process, there can be used, for example, the wet etching using hydrofluoric acid-based etchant or the like, and the dry etching such as reactive ion etching (RIE) and plasma etching. Note that, as a reference example, in the case of a single-crystal silicon supporting substrate, there is performed the wet etching using the etchant such as tetramethylammonium hydroxide solution, KOH solution, and mixing solution of hydrofluoric acid and nitric acid.

Next, in the bonding step SA2, the upper substrate 11 as a glass substrate made of the same material as a material of the supporting substrate 13 or a glass substrate similar in property to the material of the supporting substrate 13 is used. Here, a material having a thickness of 100 μm or less, which constitutes the upper substrate 11, is difficult to manufacture and handle, and in addition, is expensive. Accordingly, in place of directly bonding an originally thin upper substrate 11 onto the supporting substrate 13, an upper substrate 11 having a thickness to allow easy handling and manufacturing thereof is bonded onto the supporting substrate 13. Thereafter, by the plate thinning step SA3, the upper substrate 11 is processed by etching, polishing, and the like so as to have a desired thickness.

First, the etching mask is removed completely from the one surface of the supporting substrate 13 and the surface is cleaned. Thereafter, the upper substrate 11 is bonded onto the one surface of the supporting substrate to close the heat-insulating concave portion 32. For example, the upper substrate 11 is bonded at room temperature directly onto the supporting substrate 3, without using an adhesive layer.

The one surface of the supporting substrate 13 is covered with the upper substrate 11, in other words, the opening portion of the heat-insulating concave portion 32 is closed by the upper substrate 11, whereby a cavity portion 33 is formed between the supporting substrate 13 and the upper substrate 11. In this state, heating treatment is performed to the upper substrate 11 and the supporting substrate 13, which are bonded onto each other, and the upper substrate 11 and the supporting substrate 13 are bonded onto each other by thermal fusing (Step SA2). Hereinafter, a unit obtained by bonding the upper substrate 11 and the supporting substrate 13 onto each other is referred to as the substrate body 12.

Here, the heat-insulating cavity portion 33 has a communication structure opposed to all of the heating resistors 14 formed in an upper layer thereof, and functions as a hollow heat-insulating layer that suppresses the heat, which is generated in the heating resistors 14, from transferring from the upper substrate 11 toward the supporting substrate 13. The heat-insulating cavity portion 33 functions as the hollow heat-insulating layer, and hence an amount of heat transferred in a direction of the protective film 18 adjacent to one surfaces of the heating resistors 14 is increased more than an amount of heat transferred to the upper substrate 11 adjacent to the other surfaces of the heating resistors 14. At the time of printing, thermal paper 3 (see FIG. 1) is pressed against the protective film 18, and accordingly, the amount of heat in the direction of the protective film 18 is increased, whereby an amount of heat for use in the printing and the like is increased. As a result, utilization efficiency of the heat can be improved.

Next, in the plate thinning step SA3, the upper substrate 11 bonded onto the supporting substrate 13 is processed by the etching, the polishing, and the like so as to have the desired thickness (for example, a thickness approximately ranging from 10 to 50 μm) (Step SA3). In this manner, the upper substrate 11 that is extremely thin can be formed on the one surface of the supporting substrate 13 easily and inexpensively.

For the etching of the upper substrate 11, varieties of etching adopted for forming the heat-insulating concave portion 32 can be used as in the concave portion forming step SA1. Further, for the polishing of the upper substrate 11, for example, chemical mechanical polishing (CMP) and the like, which are used for high accuracy polishing for a semiconductor wafer and the like, can be used.

In the measurement step SA4, for example, light is irradiated onto a region of the upper substrate 11, which is opposed to the heat-insulating concave portion 32 of the supporting substrate 13, and positions of a surface and a back surface of the upper substrate 11 are detected by rays reflected on the surface and the back surface, whereby the thickness of the upper substrate 11 is measured (Step SA4).

Here, in the substrate body 12 before the heating resistors 14 are formed, both of the surface and the back surface of the upper substrate 11, which are opposed to the heat-insulating concave portion 32, face to the air. Specifically, the surface of the upper substrate 11, which is opposed to the heat-insulating concave portion 32, is exposed to the outside and is in contact with the outside air, and the back surface thereof closes the heat-insulating concave portion 32 and is thereby in contact with the air in the heat-insulating cavity portion 33.

Figure 5:
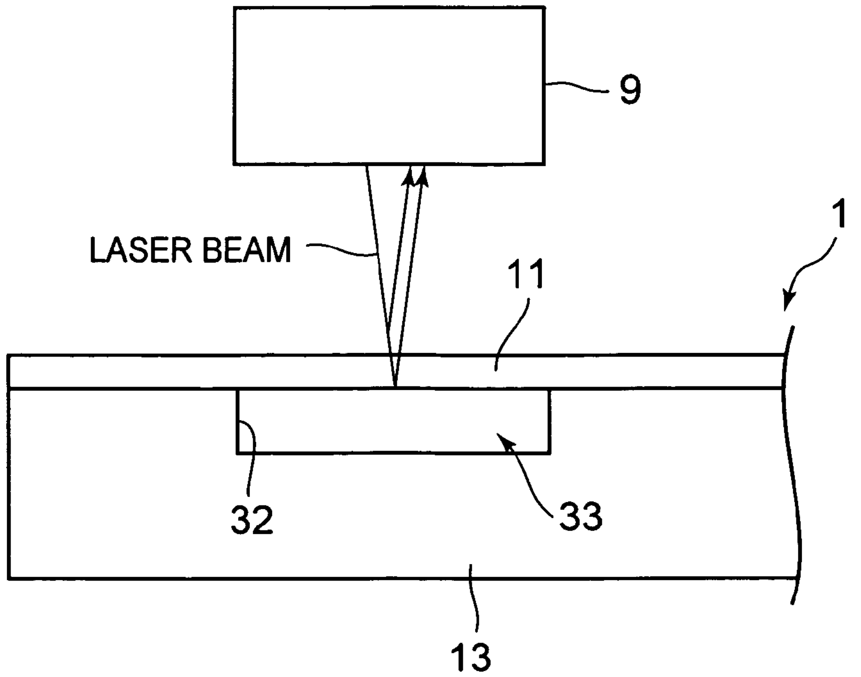
FIG. 5 is a schematic cross-sectional view illustrating a state of measuring a thickness of an upper substrate of the thermal head of FIG. 3.

Hence, for example, as illustrated in FIG. 5, when a blue laser beam is irradiated onto the above-mentioned region of the upper substrate 11, the blue laser beam is reflected individually on the surface and the back surface of the upper substrate 11 owing to a difference in refractive index between the upper substrate 11 and the air. Then, only by detecting the rays individually reflected on the surface and the back surface of the upper substrate 11 by a sensor 9 or the like, an accurate thickness dimension of the upper substrate 11 can be optically measured even in a state where the upper substrate 11 and the supporting substrate 13 are bonded onto each other.

Next, in the determination step SA5, a target resistance value corresponding to the thickness of the upper substrate 11, which is measured by the measurement step SA4, is read from a database as illustrated in FIG. 6, in which the thickness of the upper substrate 11 and the target resistance value are associated with each other. Then, the target resistance value of the heating resistors 14 is determined (Step SA5).

Next, in the resistor forming step SA6, the plurality of heating resistors 14 having the target resistance value determined in the determination step SA5 are formed at positions of the surface of the upper substrate 11, which are opposed to the heat-insulating concave portion 32 (Step SA6). On the surface of the upper substrate 11, the heating resistors 14 are formed so as to individually bridge the heat-insulating cavity portion 33 in a width direction, and are arrayed at predetermined intervals in a longitudinal direction of the heat-insulating cavity portion 33.

When the heating resistors 14 are formed, there can be used a thin film forming method such as sputtering, chemical vapor deposition (CVD), or vapor deposition. A thin film is molded from a heating resistor material such as a Ta-based material or a silicide-based material on the upper substrate 11. The thin film of the heating resistor material is molded by lift-off, etching, or the like to form the heating resistors 14 having a desired shape.

Next, in the wire forming step SA7, similarly to the resistor forming step SA6, the film formation with use of a wiring material such as Al, Al—Si, Au, Ag, Cu, and Pt is performed on the upper substrate 11 by using sputtering, vapor deposition, or the like. Then, the film thus obtained is formed by lift-off or etching, or the wiring material is screen-printed and is, for example, burned thereafter, to thereby form the electrode wires 16 (Step SA7).

The electrode wires 16 include: individual electrode wires connected to one ends of the respective heating resistors 14 in a direction perpendicular to an array direction thereof; and a common electrode wire integrally connected to the other ends of all of the heating resistors 14. Note that an order of forming the heating resistors 14 and the electrode wires 16 is arbitrary. In the patterning of a resist material for the lift-off or etching for the heating resistors 14 and the electrode wires 16, the patterning is performed on the photoresist material by using a photomask.

Next, in the protective film forming step SA8, the film formation with use of a protective film material such as $SiO_2$, $Ta_2O_5$, SiAlON, $Si_3N_4$, or diamond-like carbon is performed by sputtering, ion plating, CVD, or the like on the upper substrate 11 on which the heating resistors 14 and the electrode wires 16 are formed, whereby the protective film 18 is formed (Step SA8). The protective film 18 is formed, and hence the heating resistors 14 and the electrode wires 16 can be protected from abrasion and corrosion.

Note that, on the surface of the upper substrate 11, there are further formed: driving ICs 22 electrically connected to the respective heating resistors 14 through the electrode wires 16; an IC-coating resin film 24 that coats the driving ICs 22 and protects the driving ICs 22 from the abrasion and the corrosion; a plurality of (for example, approximately ten) power supply portions 26 which supply electric power energy to the heating resistors 14; and the like. The driving ICs 22, the IC-coating resin film 24, and the power supply portions 26 can be formed by using the publicly known manufacturing method for the conventional thermal head.

The driving ICs 22 are devices which individually control heating operations of the respective heating resistors 14. The driving ICs 22 can drive the selected heating resistors 14 while controlling voltages applied thereto through the individual electrode wires. On the upper substrate 11, two driving ICs 22 are arranged at an interval along the array direction of the heating resistors 14, and a half number of the heating resistors 14 are individually connected to each of the driving ICs 22 through the individual electrode wires.

By the steps described above, the thermal head 1 illustrated in FIG. 3 and FIG. 4 is manufactured. The thermal head 1 manufactured as described above can be fixed to a heat radiating plate 28 serving as a plate-like member made of metal such as aluminum, a resin, a ceramics, or glass. In this manner, the heat of the thermal head 1 is radiated through the heat radiating plate 28.

Further, the thermal head 1 can be used for the thermal printer 100 including: a body frame 2; a platen roller 4 arranged horizontally; the thermal head 1 arranged to be opposed to an outer circumferential surface of the platen roller 4; a paper feed mechanism 6 that feeds out an object to be printed such as the thermal paper 3 to between the platen roller 4 and the thermal head 1; and a pressure mechanism 8 that presses the thermal head 1 against the thermal paper 3 with predetermined pressing force.

In the thermal printer 100, the thermal head 1 and the thermal paper 3 are pressed against the platen roller 4 by actuation of the pressure mechanism 8. When the voltages are selectively applied to the individual electrode wires by the driving ICs 22, currents flow through the heating resistors 14 connected to the selected individual electrode wires, and the heating resistors 14 generate heat. In this state, the thermal paper 3 is pressed against a surface portion (printing portion) of the protective film 18 that covers such heating portions of the heating resistors 14 by the actuation of the pressure mechanism 8, whereby the printing can be performed in such a manner that the thermal paper 3 develops color.

As described above, in accordance with the manufacturing method for a thermal head according to this embodiment, the upper substrate 11 having the heating resistors 14 formed on its surface functions as a heat storage layer. Accordingly, the upper substrate 11 is thinned by the plate thinning step SA3. As a result, a heat capacity of the upper substrate 11 as the heat storage layer is reduced, and an amount of heat diffused toward the upper substrate 11 among the amount of heat generated in the heating resistors 14 is suppressed, to thereby make it possible to increase an amount of usable heat.

In this case, the amount of usable heat depends on the thickness of the upper substrate 11 thinned by the plate thinning step SA3. However, the target resistance value is determined by the determination step SA5 based on the thickness of the thinned upper substrate 11, which is measured by the measurement step SA4. Thus, the heating resistors 14, each accurately generating the amount of usable heat by previously estimating the amount of heat diffused toward the upper substrate 11, can be formed in the resistor forming step SA6 irrespective of the thickness of the thinned upper substrate 11.

Hence, the high-efficiency thermal head 1 capable of accurately outputting the target heating amount obtained by estimating an amount of heat wasted without being used can be easily manufactured without measuring the heating temperature of each of the heating resistors 14 or using a special apparatus for temperature measurement as the prior art.

Note that, though the configuration in which the thickness of the upper substrate 11 is optically measured in the measurement step SA4 is adopted in this embodiment, another configuration to be described below may be adopted in place of this configuration. Specifically, for example, the thickness of the supporting substrate 13 may be measured in advance before the bonding step SA2, and the thickness of the upper substrate 11 may be calculated in the measurement step SA4 by subtracting a thickness dimension of the supporting substrate 13 from a thickness dimension of the substrate body 12 that has already been subjected to the plate thinning step.

Further, this embodiment can be modified as below.

Figure 7:
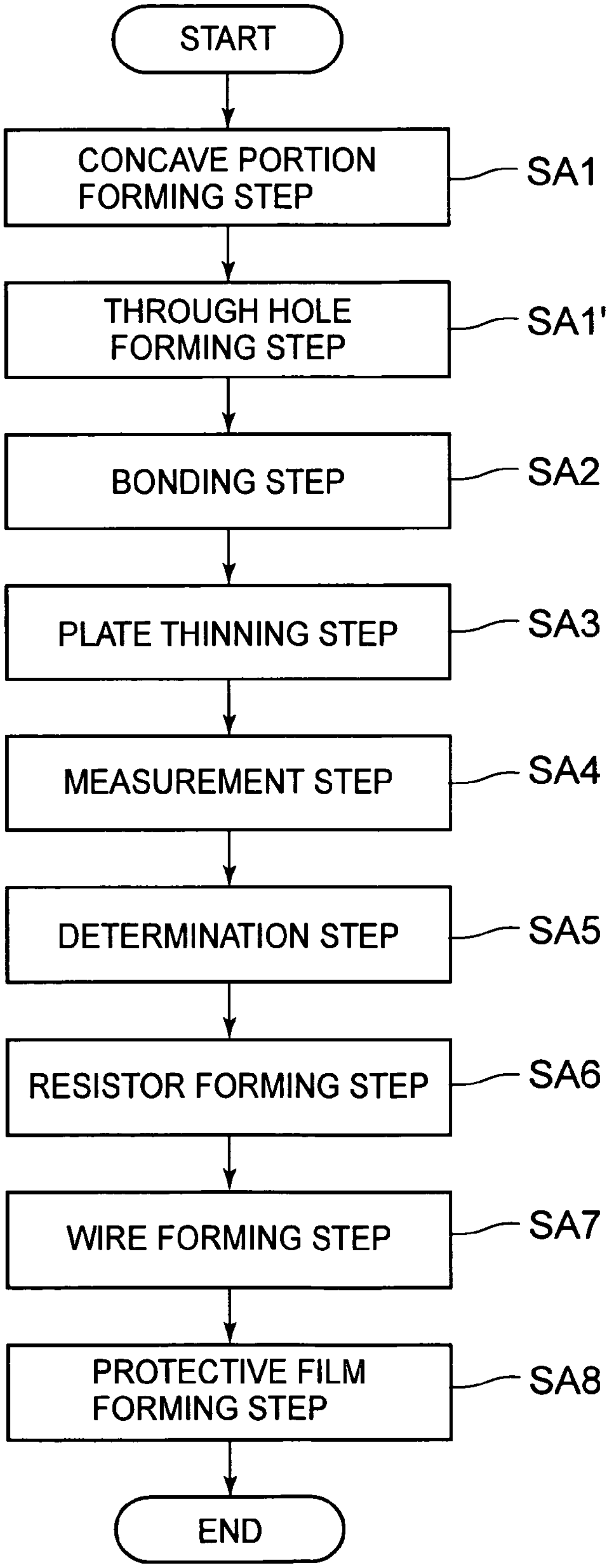
FIG. 7 is a flowchart of a manufacturing method for a thermal head according to a modification example of the first embodiment of the present invention.
Figure 8:
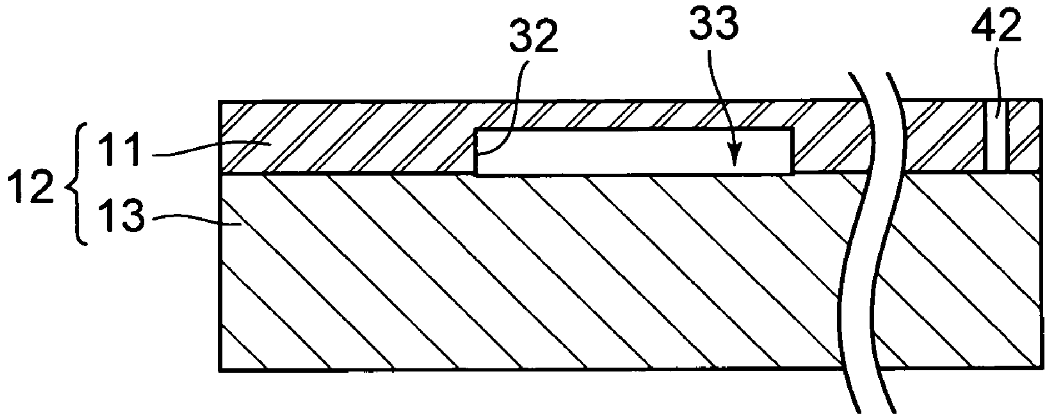
FIG. 8 is a longitudinal cross-sectional view of a thermal head taken along a direction perpendicular to a longitudinal direction of the thermal head manufactured by the manufacturing method for a thermal head according to the modification example of the first embodiment of the present invention.

For example, as illustrated in a flowchart of FIG. 7, this modification example may further include, before the bonding step SA2, a through hole forming step SA1' of forming a through hole 42 (see FIG. 8), which penetrates the upper substrate 11 in a plate thickness direction thereof, at positions in the upper substrate 11 where the heating resistors 14 are not formed. Thereafter, in the bonding step SA2, the upper substrate 11 and the supporting substrate 13 may be bonded onto each other so that one end of the through hole 42 can be closed by the one surface of the supporting substrate 13, and in the measurement step SA4, a depth of the through hole 42 of the upper substrate 11 bonded onto the supporting substrate 13 may be measured. Thus, even in a state where the upper substrate 11 and the supporting substrate 13 are bonded onto each other, the thickness of only the upper substrate 11 can be measured by measuring the depth of the through hole 42, for example, by inserting a measuring instrument such as a micrometer into the through hole 42. Note that, at the same time when the heat-insulating concave portion 32 is formed in the concave portion forming step SA1, the though hole 42 may be formed in a similar way.

Second Embodiment

A manufacturing method for a thermal head according to a second embodiment of the present invention is described below with reference to FIG. 9 and FIG. 10.

The manufacturing method for a thermal head according to this embodiment is different from that of the first embodiment in that, after a thermal head 101 that includes heating resistors 14 having a predetermined resistance value is manufactured, the resistance value of the heating resistors 14 is adjusted in response to the thickness of the upper substrate 11.

In the following description of this embodiment, components common to those in the manufacturing method for a thermal head according to the first embodiment are denoted by the same reference numerals and symbols in order to omit repetitive descriptions.

Figure 9:
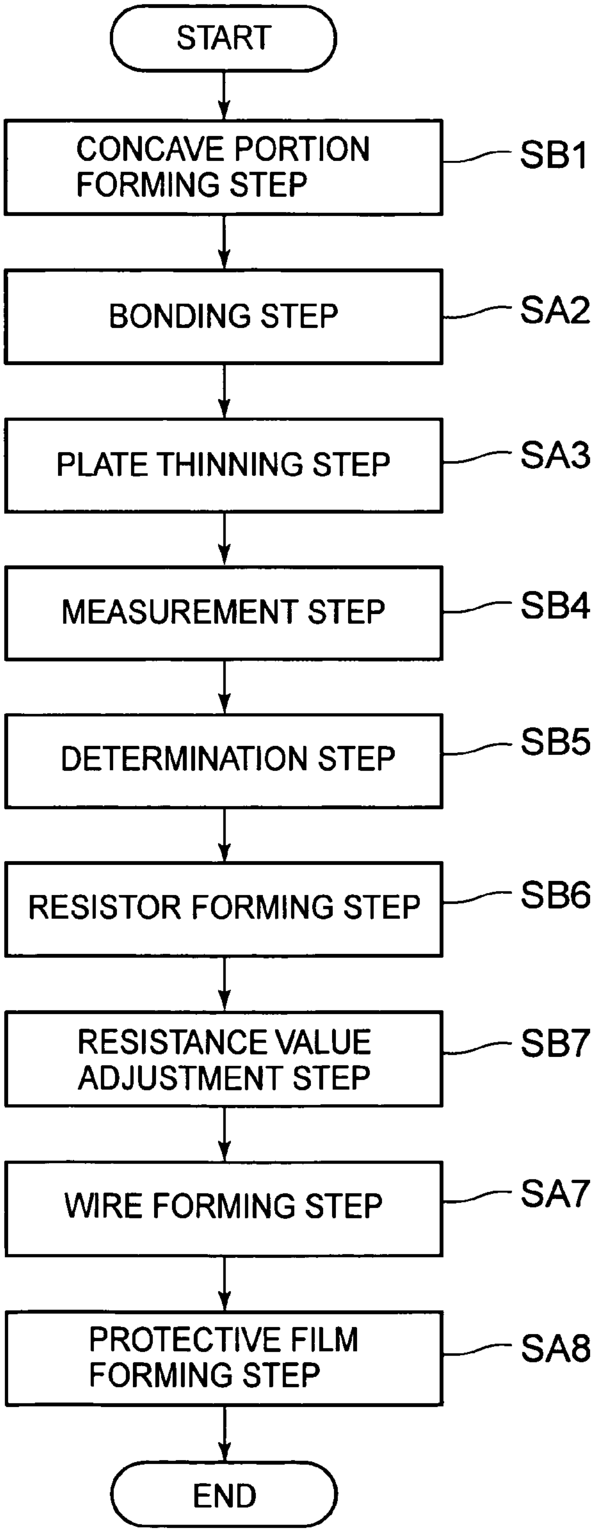
FIG. 9 is a flowchart of a manufacturing method for a thermal head according to a second embodiment of the present invention.

As illustrated in a flowchart of FIG. 9, the manufacturing method for a thermal head according to this embodiment includes: a concave portion forming step (opening portion forming step) SB1 of forming the heat-insulating concave portion 32 and thickness-measuring concave portions (opening portions) 34 (see FIG. 10 and FIG. 11), which are open to one surface of the flat plate-like supporting substrate 13; the bonding step SA2; the plate thinning step SA3; a resistor forming step SB4 of forming the heating resistors 14 at positions of the surface of the upper substrate 11 thinned by the plate thinning step SA3, the positions being opposed to the heat-insulating concave portion 32; a measurement step SB5 of measuring the thickness of the upper substrate 11 thinned by the plate thinning step SA3; a determination step SB6 of determining a target resistance value of the heating resistors 14 based on the measured thickness of the upper substrate 11; and a resistance value adjustment step SB7 of adjusting the resistance value of the heating resistors 14 so that the resistance value can be allowed to substantially conform with the target resistance value determined by the determination step SB6.

In the concave portion forming step SB1, in a similar way to the heat-insulating concave portion 32, the square thickness-measuring concave portions 34 having an opening width of approximately 100 μm are formed at positions which are not opposed to the heating resistors 14 formed on the upper substrate 14, for example, in the vicinities of corners of the bonding surface of the supporting substrate 13 (Step SB1).

In the bonding step SA2, the heat-insulating concave portion 32 and the thickness-measuring concave portions 34 of the supporting substrate 13 are closed by the upper substrate 11, whereby a heat-insulating cavity portion 33 and thickness-measuring cavity portions 35 are individually formed between the upper substrate 11 and the supporting substrate 13. In this case, the thickness-measuring concave portions 34 are formed in regions where the heating resistors 14 are not formed, whereby both of the surface and the back surface of the upper substrate 11, which are opposed to the thickness-measuring cavity portions 35, face to the air.

In the resistor forming step SB4, for example, heating resistors 14 having a resistance value higher than the target resistance value are formed on the upper substrate 11 (Step SB4). Note that, an order of the resistor forming step SB4 and the measurement step SB5 is arbitrary.

In the measurement step SB5 (Step SB5), a blue laser beam is irradiated onto regions of the upper substrate 11, which are opposed to the thickness-measuring concave portions 34 (thickness-measuring cavity portions 35), and by using the sensor 9 (see FIG. 5) or the like, positions of the surface and the back surface of the upper substrate 11 are detected by rays reflected on the surface and the back surface, whereby the thickness of the upper substrate 11 is optically measured. Note that, if a spot diameter of the blue laser is 0.9 μm that is general, then positional alignment of a laser spot can be easily performed by setting the opening width of the thickness-measuring concave portions 34 at a size of approximately 100 μm.

In the determination step SB6, a target resistance value is read from a database as illustrated in FIG. 6, in which the thickness of the upper substrate 11 and the target resistance value are associated with each other. Then, the target resistance value of the heating resistors 14 is determined (Step SB6).

In the resistance value adjustment step SB7, predetermined energy is applied to the heating resistors 14, whereby the resistance value of the heating resistors 14 is lowered and allowed to substantially conform with the target resistance value. In this manner, the resistance value of the heating resistors 14 can be changed easily in a short time. As the predetermined energy, for example, a voltage pulse may be used, or a laser beam may be used.

In the case of applying the voltage pulse to the heating resistors 14, the resistance value can be easily changed in such a manner that a voltage pulse with a higher voltage than a voltage pulse at the time of usual printing operation is just applied to the heating resistors 14 without using a special apparatus for adjusting the resistance value of the heating resistors 14. Further, in the case of irradiating the laser beam onto the heating resistors 14, a resistance value of a portion onto which the laser beam is irradiated can be partially changed. Further, by changing an irradiation width of the laser beam, a range where the resistance value of the heating resistors 14 is changed can be easily adjusted.

Figure 10:
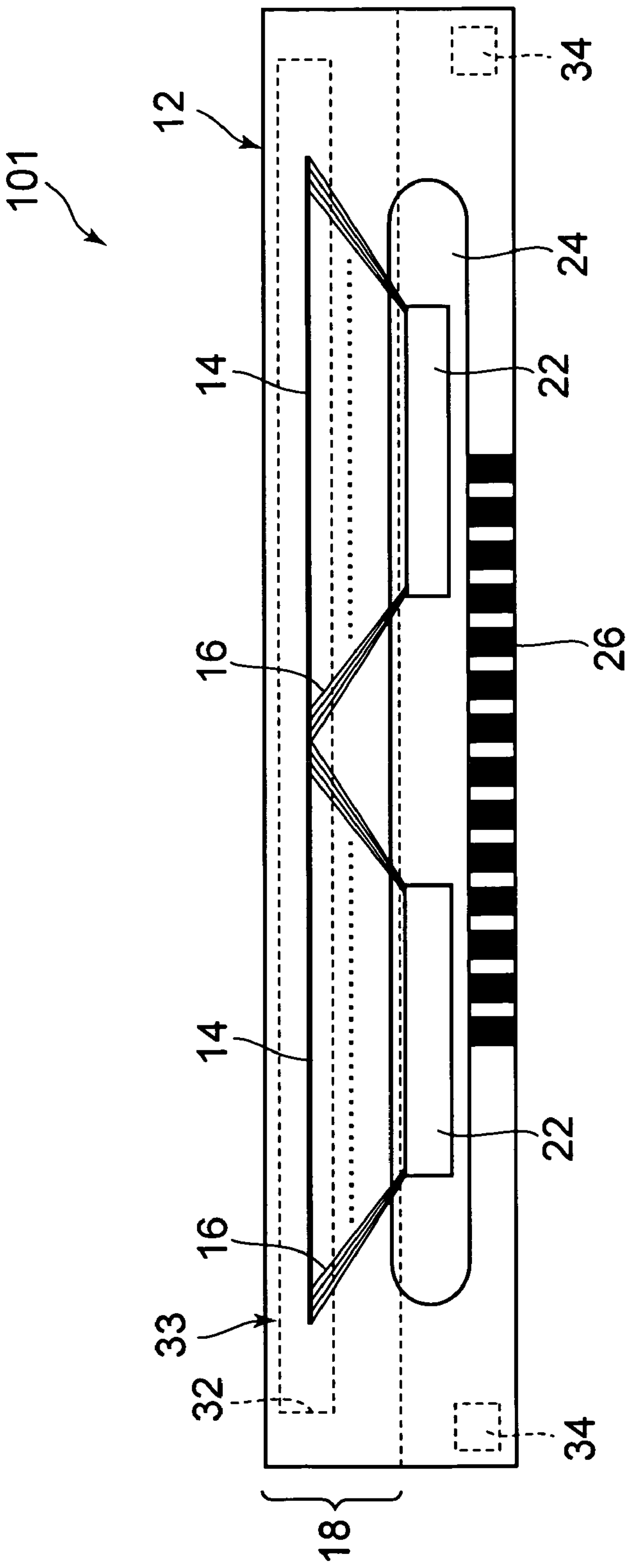
FIG. 10 is a plan view of a thermal head manufactured by the manufacturing method for a thermal head according to the second embodiment of the present invention when viewed from a protective film side.
Figure 11:
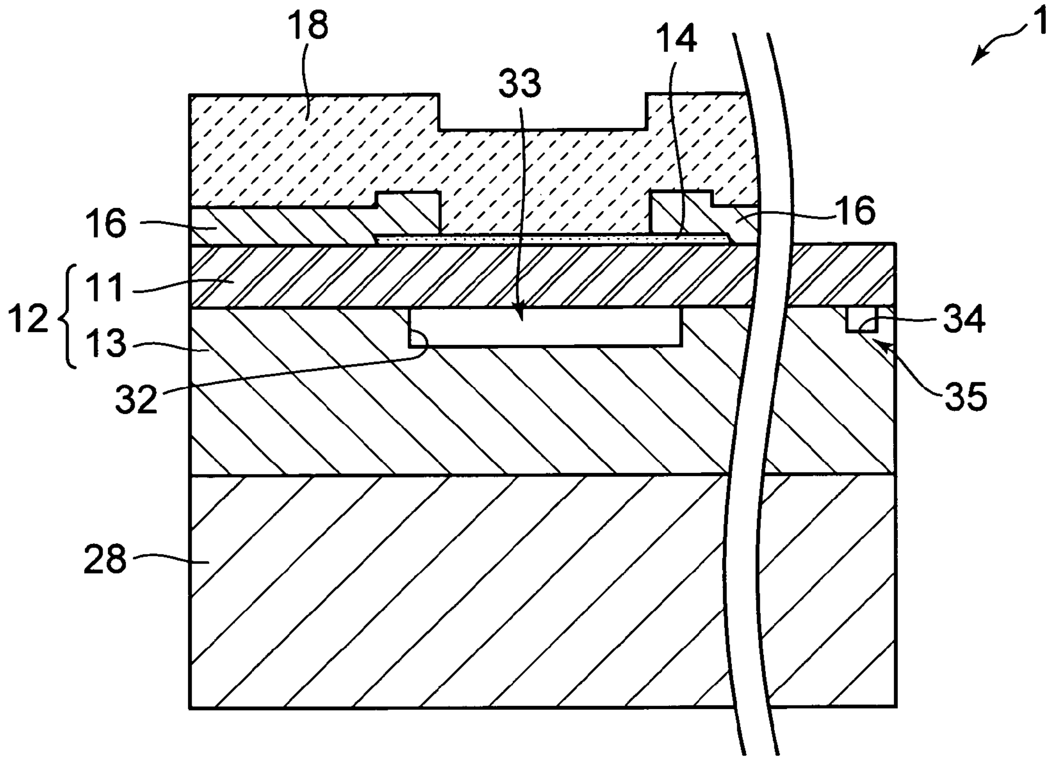
FIG. 11 is a longitudinal cross-sectional view of the thermal head of FIG. 10 taken along a direction perpendicular to a longitudinal direction of the thermal head.

After the resistance value of the heating resistors 14 is adjusted by the resistance value adjustment step SB7, the wire forming step SA7 and the protective film forming step SA8 are performed, whereby the thermal head 101 illustrated in FIG. 10 and FIG. 11 is manufactured.

As described above, in accordance with the manufacturing method for a thermal head according to this embodiment, the target resistance value is determined by the determination step SB6 based on the thickness of the thinned upper substrate 11. In this manner, in the resistance value adjustment step SB7, irrespective of the thickness of the thinned upper substrate 11, the resistance value of the heating resistors 14 can be adjusted so as to accurately generate the amount of usable heat by previously estimating the amount of heat diffused toward the upper substrate 11. Hence, the high-efficiency thermal head 101 capable of accurately outputting the target heating amount obtained by estimating the amount of heat wasted without being used can be easily manufactured without using a large-scale apparatus.

Note that, though the configuration is adopted in this embodiment, in which the heating resistors 14 having the resistance value higher than the target resistance value are formed in the resistor forming step SB4, another configuration to be described below may be adopted in place of this configuration. Specifically, in this alternative configuration, heating resistors 14 having a resistance value lower than the target resistance value may be formed. In this case, in the resistance value adjustment step SB7, the laser beam is irradiated onto the heating resistors 14, for example. Thus, the resistance value of the heating resistors 14 just needs to be increased, to thereby be allowed to substantially conform with the target resistance value.

Further, though the configuration in which the thickness-measuring concave portions 34 are formed by the concave portion forming step SB1 is adopted in this embodiment, another configuration to be described below may be adopted in place of this configuration. Specifically, the thickness of the upper substrate 11 may be calculated in such a manner that the through hole 42 is formed by the through hole forming step SA1' and that the depth of the through hole 42 is measured by the measurement step SB5.

Hereinabove, the embodiments of the present invention are described in details with reference to the drawings. However, specific configurations of the present invention are not limited to the embodiments, and design changes and the like within the scope without departing from the gist of the present invention are also encompassed therein. For example, the specific configurations are not limited to those in which the present invention is applied to the above-mentioned embodiments and modification example, but the present invention may be applied to embodiments in which these embodiments and modification example are appropriately combined with one another, and is not particularly limited.

Further, in the above-mentioned respective embodiments, the description has been made through illustrating, as the opening portions, the heat-insulating concave portion 32 and the thickness-measuring concave portion 34. However, for example, in place of the concave portions, through holes may be used, which penetrate the supporting substrate 13 in the thickness direction.

What is claimed is:

1. A manufacturing method for a thermal head, comprising:

bonding a flat upper substrate in a stacked state onto a flat supporting substrate including an opening portion open to one surface thereof so that the opening portion is closed (bonding step);

thinning the upper substrate bonded onto the supporting substrate by the bonding step (plate thinning step);

measuring a thickness of the upper substrate thinned by the plate thinning step (measurement step);

deciding a target resistance value of heating resistors based on the thickness of the upper substrate, which is measured by the measurement step (decision step); and forming, at positions of a surface of the upper substrate thinned by the plate thinning step, the heating resistors having the target resistance value determined by the decision step, the positions being opposed to the opening portion (resistor forming step).

2. A manufacturing method for a thermal head according to claim 1, further comprising:

forming the heating resistor at a position of a surface of the upper substrate thinned by the plate thinning step, the position being opposed to the opening portion (resistor forming step); and adjusting a resistance value of the heating resistors so that the resistance value substantially coincides with the target resistance value decided by the decision step (resistance value adjustment step).

3. A manufacturing method for a thermal head according to claim 1, wherein, in the measurement step, light is irradiated onto a region of the upper substrate, which is opposed to the opening portion, and wherein positions of the surface and a back surface of the upper substrate are detected by rays reflected on the surface and the back surface, whereby the thickness of the upper substrate is measured.

4. A manufacturing method for a thermal head according to claim 1, further comprising forming a through hole penetrating the upper substrate in a plate thickness direction thereof at a position of the surface of the upper substrate, where the heating resistors are prevented from being formed (through hole forming step), wherein, in the bonding step, the supporting substrate and the upper substrate are bonded onto each other so that one end of the through hole is closed by the one surface of the supporting substrate; and wherein, in the measurement step, a depth of the through hole of the upper substrate bonded onto the supporting substrate is measured.

5. A manufacturing method for a thermal head according to claim 2, wherein, in the resistance value adjustment step, predetermined energy is applied to each of the heating resistors, whereby the resistance value is adjusted.

6. A manufacturing method for a thermal head according to claim 5, wherein a voltage pulse is used as the predetermined energy.

7. A manufacturing method for a thermal head according to claim 5, wherein a laser beam is used as the predetermined energy.

8. A manufacturing method for a thermal head according to claim 1, wherein, in the decision step, the target resistance value is read from a database in which the thickness of the upper substrate and the target resistance value are associated with each other.

* * * * *